(12) United States Patent
Ross et al.

(10) Patent No.: US 11,775,300 B2
(45) Date of Patent: Oct. 3, 2023

(54) MEMORY MAPPING FOR MEMORY, MEMORY MODULES, AND NON-VOLATILE MEMORY

(71) Applicant: Micron Technology, Inc., Boise, ID (US)

(72) Inventors: Frank F. Ross, Boise, ID (US); Matthew A. Prather, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/960,523

(22) Filed: Oct. 5, 2022

(65) Prior Publication Data
US 2023/0027332 A1    Jan. 26, 2023

Related U.S. Application Data

(63) Continuation of application No. 17/156,065, filed on Jan. 22, 2021, now Pat. No. 11,474,820, which is a
(Continued)

(51) Int. Cl.
| | |
|---|---|
| *G06F 9/30* | (2018.01) |
| *G06F 3/06* | (2006.01) |
| *G06F 30/331* | (2020.01) |

(52) U.S. Cl.
CPC .......... *G06F 9/3004* (2013.01); *G06F 3/0604* (2013.01); *G06F 3/0659* (2013.01);
(Continued)

(58) Field of Classification Search
CPC .... G06F 9/3004; G06F 3/0604; G06F 3/0659; G06F 3/0679; G06F 9/30007;
(Continued)

(56) References Cited

U.S. PATENT DOCUMENTS

| | | |
|---|---|---|
| 7,894,231 B2 | 2/2011 | Kim et al. |
| 8,145,869 B2 | 3/2012 | Sargeant et al. |
| | (Continued) | |

FOREIGN PATENT DOCUMENTS

| | | |
|---|---|---|
| CN | 101231879 | 7/2008 |
| CN | 102081561 | 6/2011 |
| | (Continued) | |

OTHER PUBLICATIONS

International Search Report and Written Opinion for related PCT Application No. PCT/US2020/016485, dated May 29, 2020, 14 pages.
(Continued)

*Primary Examiner* — Sean D Rossiter
(74) *Attorney, Agent, or Firm* — Brooks, Cameron & Huebsch, PLLC

(57) ABSTRACT

Apparatuses and methods related to commands to transfer data and/or perform logic operations are described. For example, a command that identifies a location of data and a target for transferring the data may be issued to a memory device. Or a command that identifies a location of data and one or more logic operations to be performed on that data may be issued to a memory device. A memory module may include different memory arrays (e.g., different technology types), and a command may identify data to be transferred between arrays or between controllers for the arrays. Commands may include targets for data expressed in or indicative of channels associated with the arrays, and data may be transferred between channels or between memory devices that share a channel, or both. Some commands may identify data, a target for the data, and a logic operation for the data.

17 Claims, 5 Drawing Sheets

Related U.S. Application Data continuation of application No. 16/289,866, filed on Mar. 1, 2019, now Pat. No. 10,901,734.

(52) U.S. Cl.
CPC ........ *G06F 3/0679* (2013.01); *G06F 9/30007* (2013.01); *G06F 30/331* (2020.01)

(58) Field of Classification Search
CPC .... G06F 30/331; G06F 3/0646; G06F 3/0683; G06F 12/06; G06F 13/1684; G06F 13/1694; G11C 5/04
See application file for complete search history.

(56) References Cited

U.S. PATENT DOCUMENTS

| | | | |
|---|---|---|---|
| 8,375,184 | B2 | 2/2013 | Sargeant et al. |
| 9,003,109 | B1* | 4/2015 | Lam ................... G06F 3/0679 711/103 |
| 9,477,636 | B2 | 10/2016 | Walker et al. |
| 9,594,524 | B2* | 3/2017 | Lam ................... G06F 3/0688 |
| 2012/0310621 | A1 | 12/2012 | Jeong et al. |
| 2014/0156934 | A1 | 6/2014 | Ohyama |
| 2015/0178187 | A1 | 6/2015 | Sheffler et al. |
| 2015/0279433 | A1 | 10/2015 | Chinnakkonda Vidyapoornachary et al. |
| 2015/0370655 | A1 | 12/2015 | Tucek et al. |
| 2016/0371185 | A1 | 12/2016 | Brewer et al. |
| 2017/0075576 | A1 | 3/2017 | Cho |
| 2017/0242593 | A1 | 8/2017 | Riley et al. |
| 2017/0371776 | A1 | 12/2017 | Riley et al. |
| 2018/0004422 | A1 | 1/2018 | Riley et al. |
| 2018/0181494 | A1 | 6/2018 | Malladi et al. |
| 2018/0246643 | A1 | 8/2018 | Jenne et al. |
| 2018/0246790 | A1 | 8/2018 | Sankaranarayanan et al. |
| 2019/0095123 | A1* | 3/2019 | Lin ................... G06F 13/1668 |
| 2019/0369913 | A1* | 12/2019 | Hahn ................... G06F 3/0619 |

FOREIGN PATENT DOCUMENTS

| | | |
|---|---|---|
| CN | 102667752 | 9/2012 |
| CN | 102831085 | 12/2012 |
| EP | 1868074 | 12/2007 |
| KR | 1020100065759 | 6/2010 |

OTHER PUBLICATIONS

Second Office Action from related China Patent Application No. 202080017587.0, dated Jul. 21, 2022, 13 pages.

First Office Action from related China Patent Application No. 202080017587.0, dated Mar. 2, 2022, 15 pages.

\* cited by examiner

MEMORY MAPPING FOR MEMORY, MEMORY MODULES, AND NON-VOLATILE MEMORY

PRIORITY INFORMATION

This application is a Continuation of U.S. application Ser. No. 17/156,065, filed Jan. 22, 2021, which is a Continuation of U.S. application Ser. No. 16/289,866, filed Mar. 1, 2019, which issued as U.S. Pat. No. 10,901,734 on Jan. 26, 2021, the contents of which are included herein by reference.

TECHNICAL FIELD

The present disclosure relates generally to memory devices, and more particularly, to apparatuses and methods for memory mapping.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

Memory can be part of a memory module (e.g., a dual in-line memory module (DIMM)) used in computing devices. Memory modules can include volatile, such as DRAM, for example, and/or non-volatile memory, such as Flash memory or RRAM, for example. The DIMMs can be using a main memory in computing systems.

DETAILED DESCRIPTION

Figure 1A:
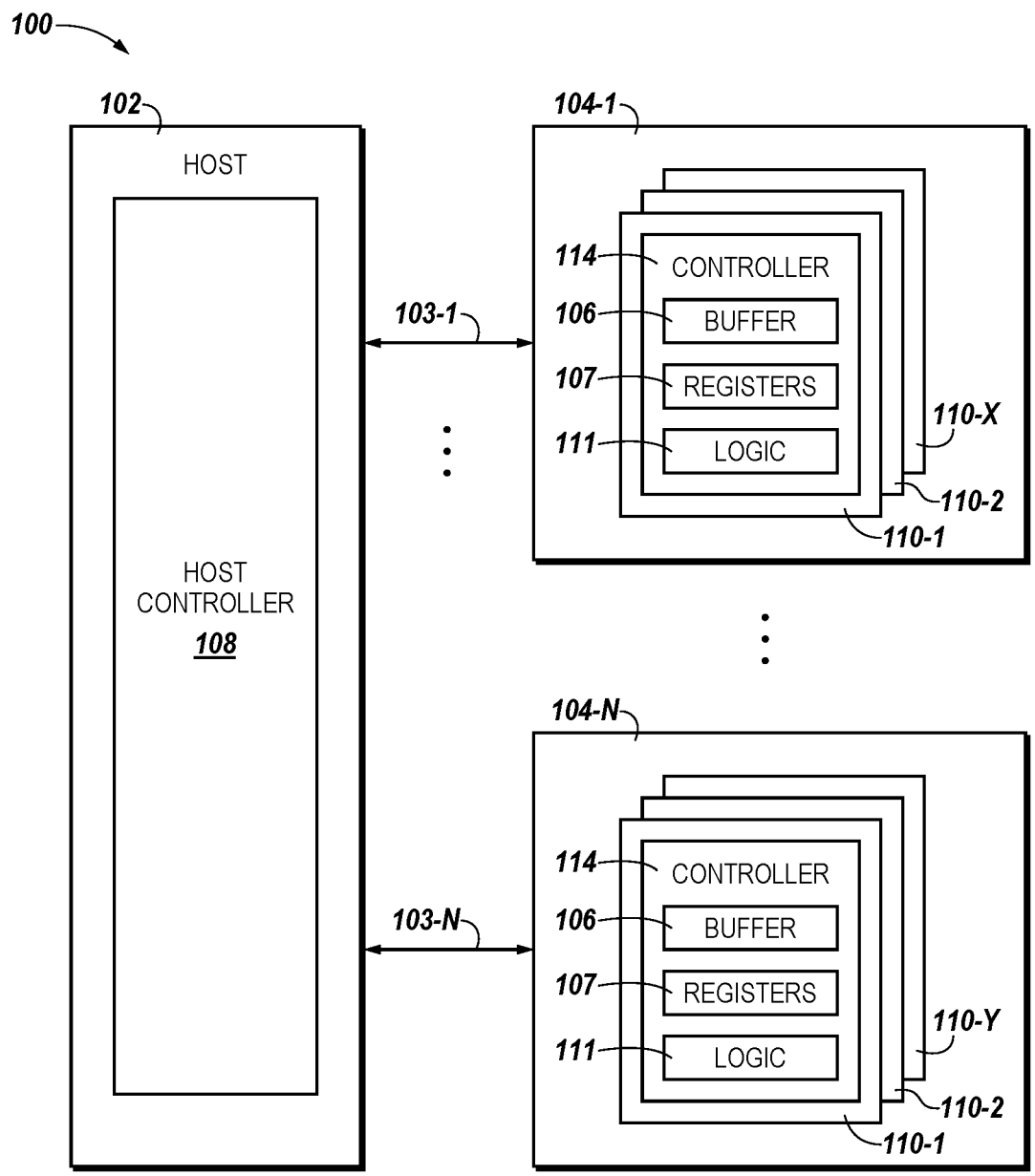
FIG. 1A is a block diagram of an apparatus in the form of a computing system including a memory apparatus in accordance with a number of embodiments of the present disclosure.

The present disclosure includes apparatuses and methods related to a memory apparatus and/or method for memory mapping using commands to transfer data and/or perform logic operations. A dual in-line memory module (DIMM), for example, can receive commands (e.g., memory mapped commands). The commands can include instructions to transfer data between memory devices and/or channels on the DIMM. The commands can include a first portion that identifies a location (e.g., address) of the data to be transferred. The commands can include a second portion that identifies a location of where the data is to be transferred. The location in the second portion of the commands can include a channel, a controller, and/or an address in a memory device on the DIMM.

In a number of embodiments, the commands can include instructions to transfer data on the DIMM. The commands can include instructions to transfer data between memory devices on a DIMM. For example, the commands can include instructions to transfer data from a volatile memory device to a non-volatile memory device on a common channel, from a volatile memory device to a volatile memory device on a common channel, and/or from a non-volatile memory device to a non-volatile memory device on a common channel. The data can be transferred between memory devices via a controller on the common channel.

The commands can include instructions to transfer data between channels on a DIMM. For example, the memory mapped commands can include instructions to transfer data from a memory device on a first channel to a controller and/or memory device on a second channel. The commands can include instructions to transfer data from a volatile memory device on first channel to a non-volatile memory device on a second channel, from a volatile memory device on a first channel to a volatile memory device on a second channel, and/or from a non-volatile memory device on a first channel to a non-volatile memory device on a second channel. The data can be transferred between memory devices on different channels via controllers on each channel. The commands can also include instructions to transfer data between controllers on different channels. For example, a controller on a first channel can be coupled to a controller on a second channel and the commands can include instructions to transfer data from the controller on the first channel to the controller on the second channel.

In a number of embodiments, the commands can include instructions to perform logic operation on data in the DIMM. The commands can include instructions to perform logic operations on data. The logic operations can be performed on a controller. The controllers can include an application specific integrated circuit (ASIC), a field programmable gate array (FPGA), and/or an arithmetic logic unit (ALU), among other types of software, hardware, and or firmware, to perform the logic operations. The commands can include instructions to transfer data that has been modified by logic operations between memory devices, controllers, and/or channels on the DIMM.

An example apparatus can include a first memory device and a second memory device coupled to a first controller on a first channel and a third memory device and a fourth memory device coupled to a second controller on a second channel. The first controller can be coupled to the second controller and the second controller can be configured to receive a command to transfer data from the third memory device, wherein the command includes a first portion that identifies a first location in the third memory device of the data and a second portion that identifies a second location where the data is to be transferred. The second controller can be configured to transfer the data from the location in the third memory device to the second location in response receiving the command.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N" indicates that a number of the particular feature so designated can be included with a number of embodiments of the present disclosure.

As used herein, "a number of" something can refer to one or more of such things. For example, a number of memory devices can refer to one or more of memory devices. Additionally, designators such as "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1A is a functional block diagram of a computing system 100 including an apparatus in the form of a number of memory systems 104-1 . . . 104-N, in accordance with one or more embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. In the embodiment illustrated in FIG. 1A, memory systems 104-1 . . . 104-N can include a one or more dual in-line memory modules (DIMM) 110-1, . . . , 110-X, 110-Y. The DIMMs 110-1, . . . , 110-X, 110-Y can include volatile memory and/or non-volatile memory. In a number of embodiments, memory systems 104-1, . . . , 104-N can include a multi-chip device. A multi-chip device can include a number of different memory types and/or memory modules. For example, a memory system can include non-volatile or volatile memory on any type of a module. The examples described below in association with FIGS. 1A-5 can use a DIMM as the memory module, but the embodiments of the present disclosure can be used on any memory system that include volatile and/or non-volatile memory. In FIG. 1A, memory system 104-1 is coupled to the host via channel 103-1 can include DIMMs 110-1, . . . , 110-X, where DIMM 110-1 is a NVDIMM and 110-X is DRAM DIMM. In this example, each DIMM 110-1, . . . , 110-X, 110-Y includes a controller 114. Controller 114 can receive commands from host 102 and control execution of the commands on a DIMM. Also, in a number of embodiments, the protocol of the present disclosure could be implemented by a memory device (e.g., a DIMM) without a controller and execution of the commands using the protocol of the present disclosure could be built into the memory device. The host 102 can send commands to the DIMMs 110-1, . . . , 110-X, 110-Y using the protocol of the present disclosure and/or a prior protocol, depending on the type of memory in the DIMM. For example, the host can use the protocol of the present disclosure to communicate on the same channel (e.g., channel 103-1) with a NVDIMM and a prior protocol to communicate with a DRAM DIMM that are both on the same memory system 104.

As illustrated in FIG. 1A, a host 102 can be coupled to the memory systems 104-1 . . . 104-N. In a number of embodiments, each memory system 104-1 . . . 104-N can be coupled to host 102 via a channel (e.g., channels 103-1, . . . , 103-N). In FIG. 1A, memory system 104-1 is coupled to host 102 via channel 103-1 and memory system 104-N is coupled to host 102 via channel 103-N. Host 102 can be a laptop computer, personal computers, digital camera, digital recording and playback device, mobile telephone, PDA, memory card reader, interface hub, among other host systems, and can include a memory access device, e.g., a processor. One of ordinary skill in the art will appreciate that "a processor" can intend one or more processors, such as a parallel processing system, a number of coprocessors, etc.

Host 102 includes a host controller 108 to communicate with memory systems 104-1 . . . 104-N. The host controller 108 can send commands to the DIMMs 110-1, . . . , 110-X, 110-Y via channels 103-1 . . . 103-N. The host controller 108 can communicate with the DIMMs 110-1, . . . , 110-X, 110-Y and/or the controller 114 on each of the DIMMs 110-1, . . . , 110-X, 110-Y to read, write, and erase data, among other operations. A physical host interface can provide an interface for passing control, address, data, and other signals between the memory systems 104-1 . . . 104-N and host 102 having compatible receptors for the physical host interface. The signals can be communicated between 102 and DIMMs 110-1, . . . , 110-X, 110-Y on a number of buses, such as a data bus and/or an address bus, for example, via channels 103-1 . . . 103-N.

The host controller 108 and/or controller 114 on a DIMM can include control circuitry, e.g., hardware, firmware, and/or software. In one or more embodiments, the host controller 108 and/or controller 114 can be an application specific integrated circuit (ASIC) and/or a field programmable gate array (FPGA) coupled to a printed circuit board including a physical interface. Also, each DIMM 110-1, . . . , 110-X, 110-Y can include buffers 106 of volatile and/or non-volatile memory and registers 107. Buffer 106 can be used to buffer data that is used during execution of commands. Controller 114 can include an application specific integrated circuit (ASIC), a field programmable gate array (FPGA), and/or an arithmetic logic unit (ALU), among other types of software, hardware, and or firmware, to perform the logic operations based on the instruction in commands.

The DIMMs 110-1, . . . , 110-X, 110-Y can provide main memory for the memory system or could be used as additional memory or storage throughout the memory system. Each DIMM 110-1, . . . , 110-X, 110-Y can include one or more arrays of memory cells on memory dies, e.g., volatile and/or non-volatile memory cells. The arrays can be flash arrays with a NAND architecture, for example. Embodiments are not limited to a particular type of memory device. For instance, the memory device can include RAM, ROM, DRAM, SDRAM, PCRAM, RRAM, and flash memory, among others.

The embodiment of FIG. 1A can include additional circuitry that is not illustrated so as not to obscure embodiments of the present disclosure. For example, the memory systems 104-1 . . . 104-N can include address circuitry to latch address signals provided over I/O connections through I/O circuitry. Address signals can be received and decoded by a row decoder and a column decoder to access the DIMMs 110-1, . . . , 110-X, 110-Y. It will be appreciated by those skilled in the art that the number of address input connections can depend on the density and architecture of the DIMMs 110-1, . . . , 110-X, 110-Y.

Figure 1B:
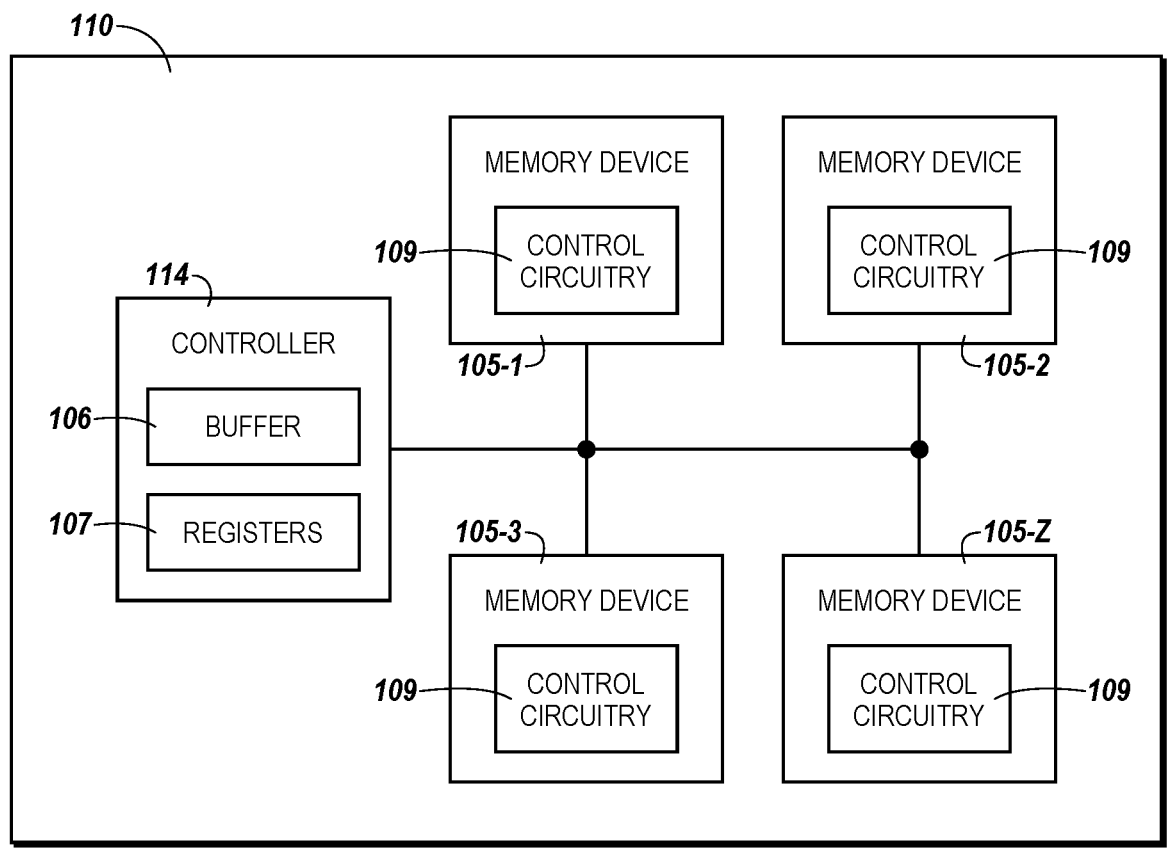
FIG. 1B is a block diagram of a non-volatile DIMM (NVDIMM) of a memory apparatus in accordance with a number of embodiments of the present disclosure.

FIG. 1B is a block diagram of an apparatus in the form of a dual in-line memory modules (DIMM) 110 in accordance with a number of embodiments of the present disclosure. In FIG. 1B, DIMM 110 can include a controller 114. Controller 114 can include memory, such as SRAM memory, that can be a buffer 106 and/or a number of registers 107. DIMM 110 can include a number of memory devices 105-1, . . . , 105-Z coupled to the controller. Memory devices 105-1, . . . , 105-Z can be volatile and/or non-volatile memory devices, such as memory devices 221 and 224 in FIG. 2, and include non-volatile memory arrays and/or volatile memory arrays. Memory devices 105-1, . . . , 105-Z can include control circuitry 109 (e.g., hardware, firmware, and/or software) which can be used to execute commands on the memory devices 105-1, . . . , 105-Z. The control circuitry 109 can receive commands from controller 114. The control circuitry 109 can be configured to execute commands to read and/or write data in the memory devices 105-1, . . . , 105-Z.

Figure 2:
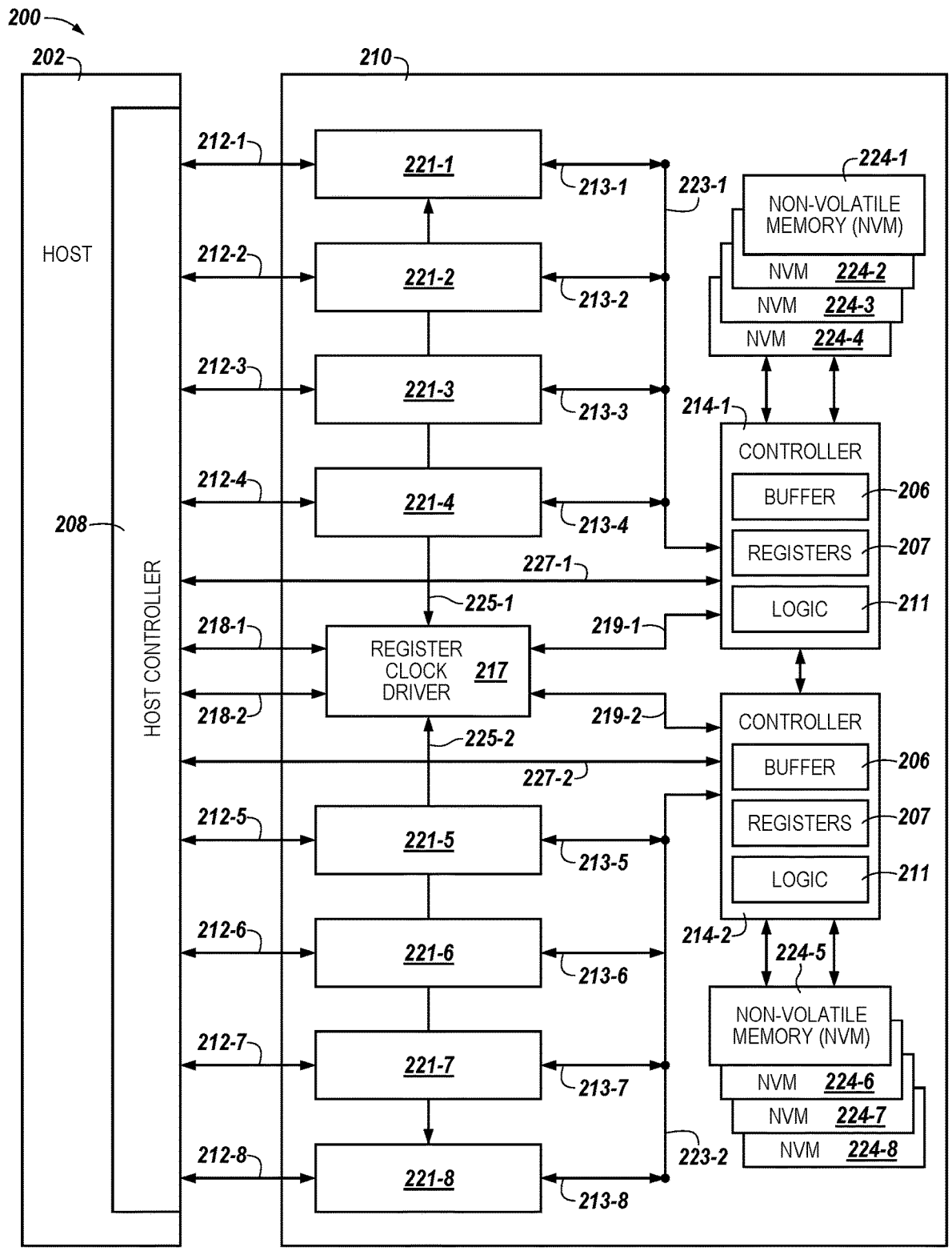
FIG. 2 is a block diagram of a computing system including a host and a memory system comprising a dual in-line memory module (DIMM) with a ready/busy bus in accordance with a number of embodiments of the present disclosure.

FIG. 2 is a block diagram of a computing system 200 including a host 202 and a memory system comprising a dual in-line memory module (DIMM) 210 with a first and second controller and a first and second ready/busy bus in accordance with a number of embodiments of the present disclosure. In FIG. 2, host 202 is coupled to DIMM 210 via data buses 212-1, . . . , 212-8, command/address buses 218-1 and 218-2, and ready/busy buses 227-1 and 227-2. Host 202 can be coupled to DIMM 210 via a number of channels (e.g., channels 103-1, . . . , 103-N in FIG. 1A). For example, host 202 is coupled to DIMM 210 via a first channel (e.g., channel 103-1 in FIG. 1A) that includes memory devices 221-1, . . . , 221-4 and 224-1, . . . , 224-4 coupled via data buses 212-1, . . . , 212-4, command/address bus 218-1, and ready/busy bus 227-1; and host 202 is coupled to DIMM 210 via a second channel (e.g., channel 103-1 in FIG. 1A) that includes memory devices 221-5, . . . , 221-8 and 224-5, . . . , 224-8 coupled via data buses 212-5, . . . , 212-8, command address/bus 218-2, and ready/busy bus 227-2. Controller 214-1 can receive commands from host 202 on channel 1 and controller 214-2 can receive commands from host 202 on channel 2. The commands from host 202 can be sent to register clock driver (RCD) 217 via buses 218-1 and/or 218-2 and the commands can be sent from RCD 217 to controller 214-1 via bus 219-1 and controller 214-2 via bus 219-2.

DIMM 210 can include controller 214-1 and 214-2. Controller 214-1 can be coupled to and send signals to control operation of memory devices 221-1, 221-4 and memory devices 224-1, . . . , 224-4. Controller 214-2 can be coupled to and send signals to control operation of memory devices 221-5, . . . , 221-8 and memory devices 224-5, . . . , 224-8. DIMM 210 with controllers 214-1 and 214-2 can allow memory devices 221-1, . . . , 221-4 and memory devices 224-1, . . . , 224-4 to operate independently from memory devices 221-5, . . . , 221-8 and memory devices 224-5, . . . , 224-8. Controller 214-1 is coupled to controller 214-2 and data can be transferred between controller 214-1 and 214-2. Therefore controller 214-1 can operate memory devices 221-1, . . . , 221-4 and memory devices 224-1, . . . , 224-4 independently from other memory device and also transfer data from memory devices 221-1, . . . , 221-4 and memory devices 224-1, . . . , 224-4 to other memory devices, such as memory devices 221-5, . . . , 421-8 and memory devices 224-5, . . . , 224-8.

In a number of embodiments, DIMM 210 can receive commands (e.g., memory mapped commands). The commands can include instructions to transfer data between memory devices 221-1, . . . , 221-8 and 224-1, . . . , 224-8 and/or channels on the DIMM. The commands can include a first portion that identifies a location (e.g., address) of the data in memory devices 221-1, . . . , 221-8 and 224-1, . . . , 224-8 to be transferred (e.g., an origin). The commands can include a second portion that identifies a location of where the data is to be transferred (e.g., a destination). The location in the second portion of the commands can include a channel, a controller 214-1 and 214-2, and/or an address in memory device memory devices 221-1, . . . , 221-8 and 224-1, . . . , 224-8 on the DIMM.

The commands can include instructions to transfer data between memory devices memory devices 221-1, . . . , 221-8 and 224-1, . . . , 224-8 on DIMM 210. For example, the commands can include instructions to transfer data from memory devices 221-1, . . . , 221-4 to memory devices 224-1, . . . , 224-4 on a first channel, from memory devices 221-1, . . . , 221-4 to memory devices 221-1, . . . , 221-4 on a first channel, and/or from memory devices 224-1, . . . , 224-4 to memory devices 224-1, . . . , 224-4 on a first channel, or from memory devices 224-1, . . . , 224-4 to memory devices 221-1, . . . , 221-4 on a first channel. The data can be transferred between memory devices via controller 214-1 on the first channel.

The commands can include instructions to transfer data between channels on a DIMM. The commands can include instructions to transfer data from a memory device on a first channel to a controller and/or memory device on a second channel. For example, the commands can include instructions to transfer data from memory devices 221-1, . . . , 221-4 on first channel to memory devices 224-5, . . . , 224-8 on a second channel, from memory devices 221-1, . . . , 221-4 on a first channel to memory devices 221-5, . . . , 221-8 on a second channel, and/or from memory devices 224-1, . . . , 224-4 on a first channel to memory devices 224-5, . . . , 224-8 on a second channel. The data can be transferred between memory devices on different channels via controllers 214-1 and 214-2. The commands can also include instructions to transfer data between controllers 214-1 and 214-2. For example, controller 214-1 on a first channel can be coupled to controller 214-2 on a second channel and the commands can include instructions to transfer data from controller 214-1 on the first channel to the controller 214-2 on the second channel.

In a number of embodiments, the commands can include instructions to perform logic operation on data in the DIMM 210. The commands can include instructions to perform logic operations on data stored in DIMM 210. The logic operations can be performed on controllers 214-1 and 214-2. Controllers 214-1 and 214-2 include logic 211 that can include an application specific integrated circuit (ASIC), a field programmable gate array (FPGA), and/or an arithmetic logic unit (ALU), among other types of software, hardware, and or firmware, to perform the logic operations. The commands can include instructions to transfer data that has been modified by logic operations between memory devices 221-1, . . . , 221-8 and 224-1, . . . , 224-8, controllers 214-1 and 214-2, and/or channels on the DIMM 210.

DIMM 210 can include a first number of memory devices 221-1, . . . , 221-8. For example, memory devices 221-1, . . . , 221-8 can be DRAM memory devices, among other types of volatile and/or non-volatile memory. DIMM 210 can include a second number of memory devices 224-1, . . . , 224-8. For example, memory devices 221-1, . . . , 221-8 can be 3D XPoint memory devices, among other types of volatile and/or non-volatile memory.

Controllers 214-1 and 214-2 can send a ready/busy signal to host 202 on the ready/busy buses 227-1 and 224-2, respectively. The ready/busy signal can indicate to host 202 whether or not the controller 214-1 and/or 214-2 is ready to receive commands from host 202. For example, if controller 214-1 on DIMM 210 is busy executing commands, such as transferring data between memory devices 221-1, . . . , 221-4 and memory devices 224-1, . . . , 224-4, the controller 214-1 is not ready to receive commands on channel 1, but controller 214-2 could receive commands on channel 2. A ready/busy signal can be sent by controller 214-1 on ready/busy bus 227-1 to host 202 that indicates controller 214-1 is not ready to receive commands on channel 1 and a ready/busy signal can be sent by controller 214-2 on ready/busy bus 227-2 to host indicating controller 214-2 is ready to receive command from host 202 on channel 2. Host 202 can send commands on the second channel to controller 214-2 for execution on memory device 221-5, . . . , 221-8 and/or memory devices 224-5, . . . , 224-8. Once controller 214-1 is no longer busy executing commands, such as commands that transfer data on memory device associated with channel 1, controller 214-1 can send a ready/busy signal on ready/busy bus 227-1 to host 202 indicating controller 214-1 is ready to receive commands from host 202 on channel 1. Host 202 can send commands to controller 214-1 on channel 1 in response to receiving the ready/busy signal.

Controllers 214-1 and 214-2 can receive commands from host 202, such as commands. The commands from host 202 can be sent to register clock driver (RCD) 217 via buses 218-1 and/or 218-2 and the commands can be sent from RCD 217 to controllers 214-1 and 214-2 via buses 219-1 and/or 219-2, respectively. Controllers 214-1 and 214-2 can receive the commands from RCD 217 and store data associated with the commands (e.g., command instructions and/or data read from and/or to be written to memory devices 221 and/or 224 during execution of the commands) in buffer 206. Controllers 214-1 and 214-2 can send the commands to memory devices 221-1, . . . , 221-8 on bus 225-1 and/or 225-2 via RCD 217 and memory devices 221-1, . . . , 221-8 can execute the commands by transferring data between memory devices 221-1, . . . , 221-8 and host 202 and/or memory devices 221-1, . . . , 221-8 and memory device 224-1, . . . , 224-8. Memory devices 221-1, . . . , 221-8 can send signals on buses 225-1 and 225-2 to RCD 217 and controllers 214-1 and 214-2 that indicate memory devices 221-1, . . . , 221-8 have completed execution of commands and are ready for additional commands. Once a command has been executed, controllers 214-1 and 214-2 can send a status signal to the host 202 indicating that the command received from host 202 has been executed. Controllers 214-1 and 214-2 can include non-volatile and/or volatile memory, such as SRAM memory, that can be a buffer 206 and/or a register 207 used during execution of commands.

Memory system 200 can be configured to execute commands sent from host 202 to DIMM 210 by sending command/address information from the host controller 208 on command/address bus 218 to the register clock driver (RCD) 217 and data on data buses 212-1, . . . , 212-8. The commands from the host can include address information for memory devices 221-1, . . . 221-8 where the host is requesting an operation on data at particular location in memory devices 221-1, . . . 221-8. The commands from the host can include address information for memory devices 224-1, . . . , 224-4 where the host is requesting an operation on data at particular location in memory devices 224-1, . . . , 224-4, while memory devices 221-2, . . . 221-8 can act as a buffer during execution of the commands.

In a number of embodiments, memory devices 221-1, . . . 221-8 can be configured as cache. For example, memory devices can be configured as cache for the data stored in memory devices 224-1, . . . , 224-8 and/or other memory devices coupled to the computing system. The DIMM 210 can be configured to have a portion of memory devices 221-1, . . . 221-8 addressable by host 202 and a portion of the memory devices 221-1, . . . 221-8 configured as cache.

In a number of embodiments, commands can be received from host 202 and/or generated by controllers 214-1 and 214-2 to transfer data between memory devices 224-1, . . . , 224-8. Data can be transferred between memory devices 224-1, . . . , 224-8 via controllers 214-1 and 214-2 using buffers 206 and/or registers 207.

Figure 3A:
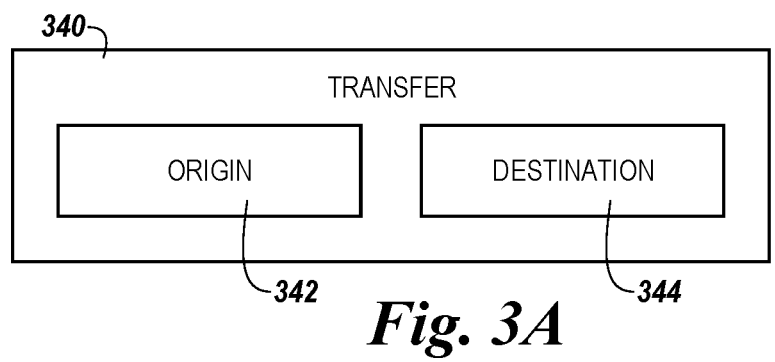
FIG. 3A is a block diagram of a command to transfer data in accordance with a number of embodiments of the present disclosure.

FIG. 3A is a block diagram of a command 340 to transfer data in accordance with a number of embodiments of the present disclosure. Command 340 can include an origin 342 of the data that is to be transferred during execution of the command. Origin 342 can include an address of the data in a memory device on a DIMM. Origin 342 can also include a location on a controller, such as data stored in a register and/or buffer on a controller. Command 340 can include a destination 344 for data during execution of the command. Destination 344 can be a memory device and/or a controller, among other location on a DIMM. Destination 344 of the command can include an address of a memory device on the DIMM.

Figure 3B:
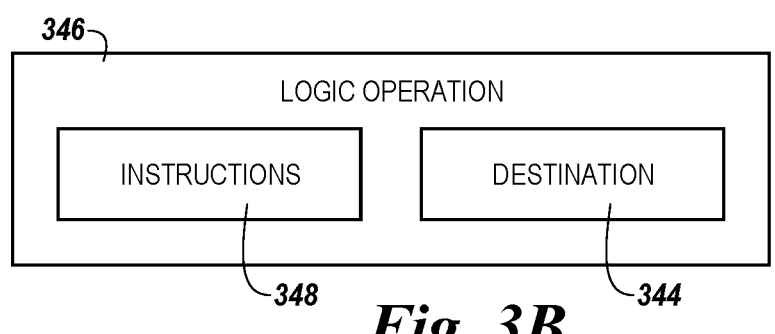
FIG. 3B is a block diagram of a command to perform logic operations in accordance with a number of embodiments of the present disclosure.

FIG. 3B is a block diagram of a command to perform logic operations in accordance with a number of embodiments of the present disclosure. Command 346 can include instructions 348 for performing logic operations on data. Instructions 348 can be executed by a controller. Command 346 can include a destination 344 for data that was manipulated by the logic operations. Destination 344 can be a memory device and/or a controller, among other location on a DIMM. Destination 344 of the command can include an address of a memory device on the DIMM.

Figure 4:
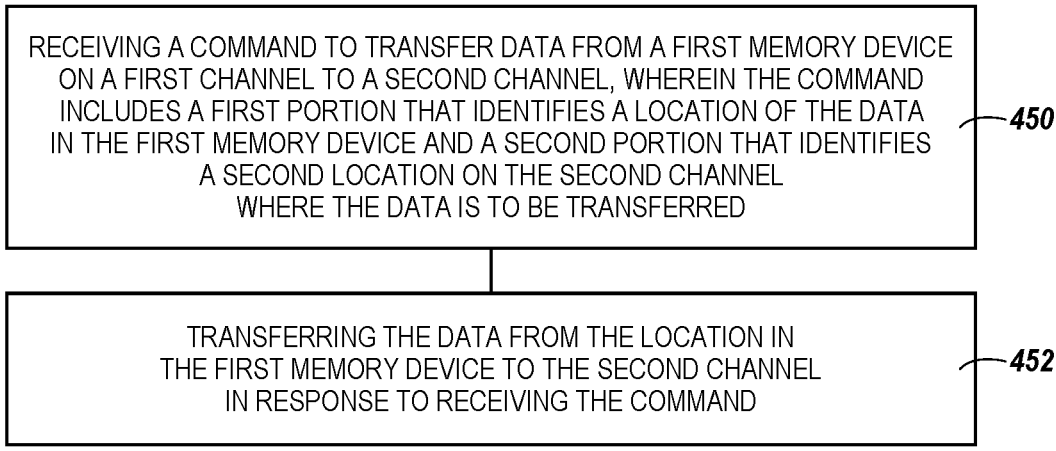
FIG. 4 is a flow diagram illustrating an example process including commands in accordance with a number of embodiments of the present disclosure.

FIG. 4 is a flow diagram illustrating an example process including commands in accordance with a number of embodiments of the present disclosure. The process described in FIG. 4 can be performed by, for example, a memory system including a NVDIMM such as DIMM 210 shown in FIG. 2.

At block 450, the process can include receiving a command to transfer data from a first memory device on a first channel to a second channel, wherein the command includes a first portion that identifies a location of the data in the first memory device and a second portion that identifies a second location on the second channel where the data is to be transferred.

At block 452, the process can include transferring the data from the location in the first memory device to the second channel in response receiving the command.

Figure 5:
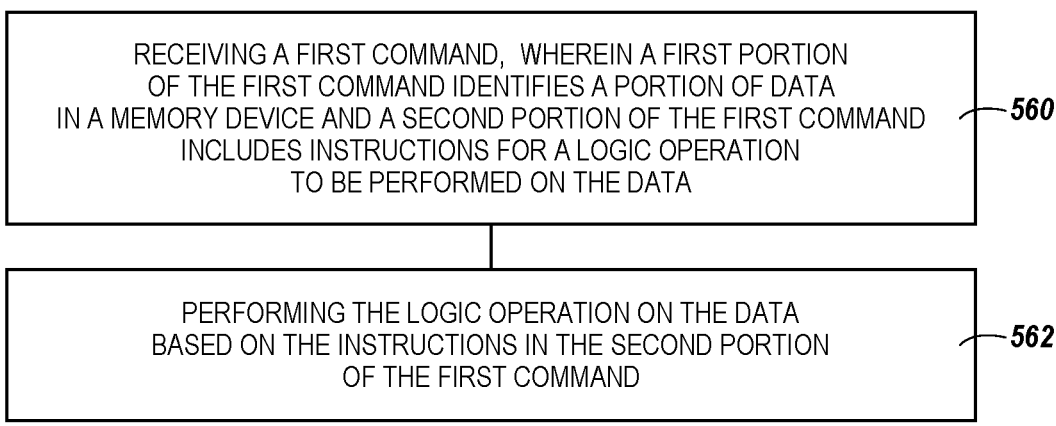
FIG. 5 is a flow diagram illustrating an example process including commands in accordance with a number of embodiments of the present disclosure.

FIG. 5 is a flow diagram illustrating an example process including commands in accordance with a number of embodiments of the present disclosure. The process described in FIG. 5 can be performed by, for example, a memory system including a NVDIMM such as DIMM 210 shown in FIG. 2.

At block 560, the process can include receive a first command, wherein a first portion of the first command identifies a portion of data in a memory device and a second portion of the first command includes instructions for a logic operation to be performed on the data.

At block 562, the process can include performing the logic operations on the data based on the instructions in the second portion of the first command.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). For the avoidance of doubt, a list of at least one of A, B, or C, or any combination thereof is likewise an inclusive list. Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a first memory device and a second memory device coupled to a first controller, wherein the first controller is configured to:
      receive a first command to transfer data from the first memory device, wherein the first command includes a first portion that identifies a first location in the first memory device of the data and a second portion that identifies a second location where the data is to be transferred; and
      receive a second command that includes instructions for a logic operation to be performed on the data, wherein the second command includes instructions to transfer data modified by the logic operation from the first controller to the second memory device.

2. The apparatus of claim 1, wherein the second location is the first controller.

3. The apparatus of claim 1, wherein the second portion of the first command includes instructions to transfer the data to the first controller.

4. The apparatus of claim 1, wherein the controller is configured to cause a transfer of the data from the location in the first memory device to the second location in response receiving the first command.

5. The apparatus of claim 1, wherein the controller is configured to cause the logic operation to be performed on the data in response receiving the second command.

6. The apparatus of claim 1, wherein the first memory device is a non-volatile memory (NVM) device and the second memory device is a volatile memory (VM) device.

7. An apparatus, comprising:
   a first memory device and a second memory device coupled to a first controller, wherein the first controller is configured to:
      receive a first command to transfer data from the first memory device, wherein the first command includes a first portion that identifies a first location in the first memory device of the data and a second portion that includes instructions for a logic operation to be performed on the data;
      transfer the data from the location in the first memory device to the first controller in response receiving the first command; and
      receive a second command with instructions to store the data modified by the logic operation in the second memory device.

8. The apparatus of claim 7, wherein the second command includes instructions to transfer the data modified by the logic operation to a second controller.

9. The apparatus of claim 8, wherein the second controller receives instructions to store the data modified by the logic operation in a third memory device.

10. The apparatus of claim 7, wherein the first controller receives a third command with instructions to perform additional logic operations on the data.

11. The apparatus of claim 10, wherein the third command includes instructions for the first controller to transfer the data modified by the additional logic operations to the second memory device.

12. The apparatus of claim 10, wherein the third command includes instructions for the first controller to transfer the data modified by the additional logic operations to a second memory controller.

13. The apparatus of claim 7, wherein the first controller includes a field programmable gate array (FPGA) configured to perform logic operations.

14. A method, comprising:
receiving a first command to transfer data from a first memory device to a second memory device, wherein the command includes a first portion that identifies a location of the data in the first memory device and a second portion that identifies a second location where the data is to be transferred; and
receive a second command that includes instructions for a logic operation to be performed on the data, wherein the second command includes instruction to transfer data modified by the logic operation to a second memory device.

15. The method of claim 14, further including transferring the data from the location in the first memory device to the second location in a first controller in response to receiving the first command.

16. The method of claim 14, further including performing the logic operation on the data in response to receiving the second command.

17. The method of claim 14, wherein the second command includes instruction to transfer data modified by the logic operation to a second controller.

* * * * *